US007847834B2

(12) United States Patent
Dai et al.

(10) Patent No.: US 7,847,834 B2
(45) Date of Patent: *Dec. 7, 2010

(54) LIGHT SOURCE FREQUENCY DETECTION CIRCUIT USING BIPOLAR TRANSISTOR

(75) Inventors: Tiejun Dai, Sunnyvale, CA (US); Sohei Manabe, San Jose, CA (US); Hongtao Yao, Sunnyvale, CA (US); Jingzhou Zhang, Santa Clara, CA (US); Liping Deng, Cupertino, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 435 days.

This patent is subject to a terminal disclaimer.

(21) Appl. No.: 11/942,604

(22) Filed: Nov. 19, 2007

(65) Prior Publication Data

US 2009/0128660 A1   May 21, 2009

(51) Int. Cl.
   *H04N 9/73*   (2006.01)
(52) U.S. Cl. .................. 348/227.1; 348/226.1
(58) Field of Classification Search .............. 348/226.1, 348/227.1, 228.1
   See application file for complete search history.

(56) References Cited

U.S. PATENT DOCUMENTS

| 5,053,871 | A | 10/1991 | Ogawa et al. |
| 5,239,369 | A | 8/1993 | Suzuki |
| 5,270,553 | A * | 12/1993 | Miller .................... 250/559.01 |
| 6,657,659 | B1 | 12/2003 | Van Rooy et al. |
| 7,034,870 | B2 | 4/2006 | Nagaoka et al. |
| 7,521,662 | B1 * | 4/2009 | Fassbender et al. ...... 250/214 A |
| 7,605,359 | B2 * | 10/2009 | Dai et al. ................. 250/214 R |
| 2003/0081138 | A1 | 5/2003 | Hofer et al. |
| 2004/0201729 | A1 * | 10/2004 | Poplin et al. ............. 348/226.1 |
| 2005/0225649 | A1 | 10/2005 | Shinotsuka |
| 2005/0246143 | A1 | 11/2005 | Han et al. |
| 2006/0131484 | A1 * | 6/2006 | Peting .................... 250/214 R |
| 2007/0126895 | A1 | 6/2007 | Goarant et al. |
| 2007/0153094 | A1 * | 7/2007 | Noyes et al. ............. 348/226.1 |
| 2007/0247531 | A1 | 10/2007 | Deng et al. |

FOREIGN PATENT DOCUMENTS

WO   WO 2007/049900   5/2007

OTHER PUBLICATIONS

PCT/US2008/082533 International Search Report and Written Opinion of the International Searching Authority mailed Feb. 11, 2009, 11 pages.
U.S. Appl. No. 11/901,212, filed Sep. 14, 2007, Dai et al.
J. Hurwitz, et al., "A Miniature Imaging Module for Mobile Applications," IEEE International Solid-State Circuits Conference, 2001. ISBN 0-7803-6608-5.

* cited by examiner

*Primary Examiner*—Sinh Tran
*Assistant Examiner*—Jason A Flohre
(74) *Attorney, Agent, or Firm*—Blakely Sokoloff Taylor & Zafman LLP

(57) ABSTRACT

An apparatus for measuring the power frequency of a light source includes a photo-sensitive transistor, a modulators and a logic unit. The photo-sensitive transistor generates an electrical signal that is responsive to light incident thereon from the light source. The modulator generates a modulated signal based on the electrical signal that toggles at a rate substantially proportional to the power frequency of the light source. The logic unit is coupled to receive the modulated signal and determine its toggling frequency.

24 Claims, 6 Drawing Sheets

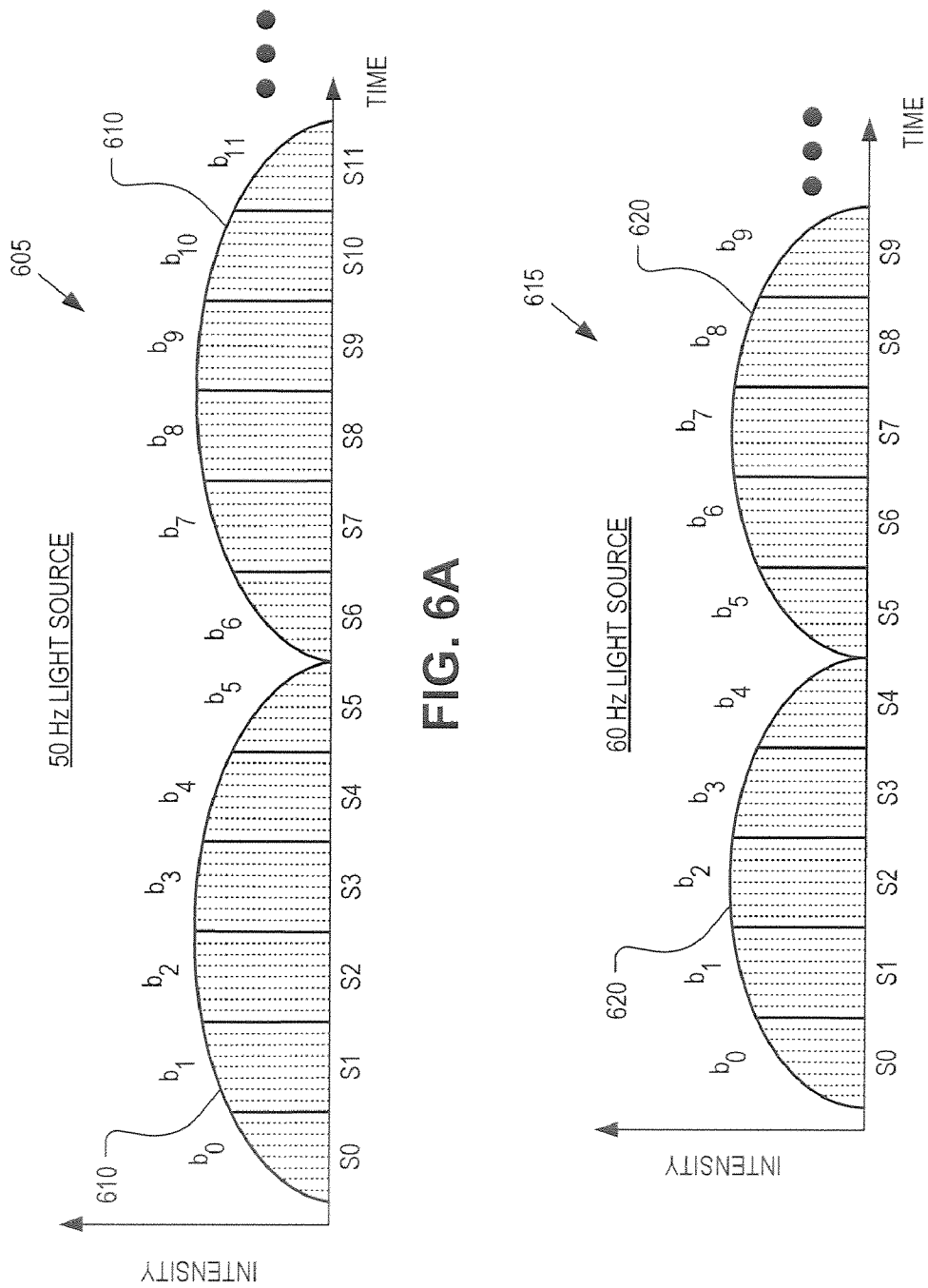

US 7,847,834 B2

LIGHT SOURCE FREQUENCY DETECTION CIRCUIT USING BIPOLAR TRANSISTOR

TECHNICAL FIELD

This disclosure relates generally to electronic circuits, and in particular but not exclusively, relates to a light source frequency detection circuit to compensate for light source flicker.

BACKGROUND INFORMATION

Light source flicker is the repetitious fading, pulsing, or flickering of a light source due to the alternating current ("AC") frequency of the power driving the light source. Two power source frequencies predominate throughout the developed world—60 Hz (predominant in North America) and 50 Hz (predominant in Europe).

Modern imaging devices (e.g., still cameras or video cameras) often use pixel arrays (e.g., CCD arrays or CMOS arrays) to capture images. When capturing images illuminated by a flickering light source using modern pixel arrays, the rate of flickering can affect the quality of the image captured. The pixel arrays may be calibrated or tuned to compensate for one of the predominant power source frequencies. Such calibration may include synchronized image acquisition, auto-gain compensation, exposure time, or otherwise. As such, imaging devices may be designed for a particular regional market (e.g., Europe, North America) to automatically compensate for a particular power frequency (e.g., 50 Hz or 60 Hz). Some electronic devices may even include complicated and expensive circuitry to analyze the acquired image data to determine the light source power frequency. For devices that dynamically determine the light source power frequency, it is desirable to be able to detect the 50 Hz or 60 Hz power frequency in both high luminance and low luminance environments.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 6A is a graph illustrating sampling blocks of a modulation signal corresponding to a 50 Hz light source, in accordance with an embodiment of the invention.

FIG. 6B is a graph illustrating sampling blocks of a modulation signal corresponding to a 60 Hz light source, in accordance with an embodiment of the invention.

DETAILED DESCRIPTION

Embodiments of an apparatus and technique for light source power frequency detection are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
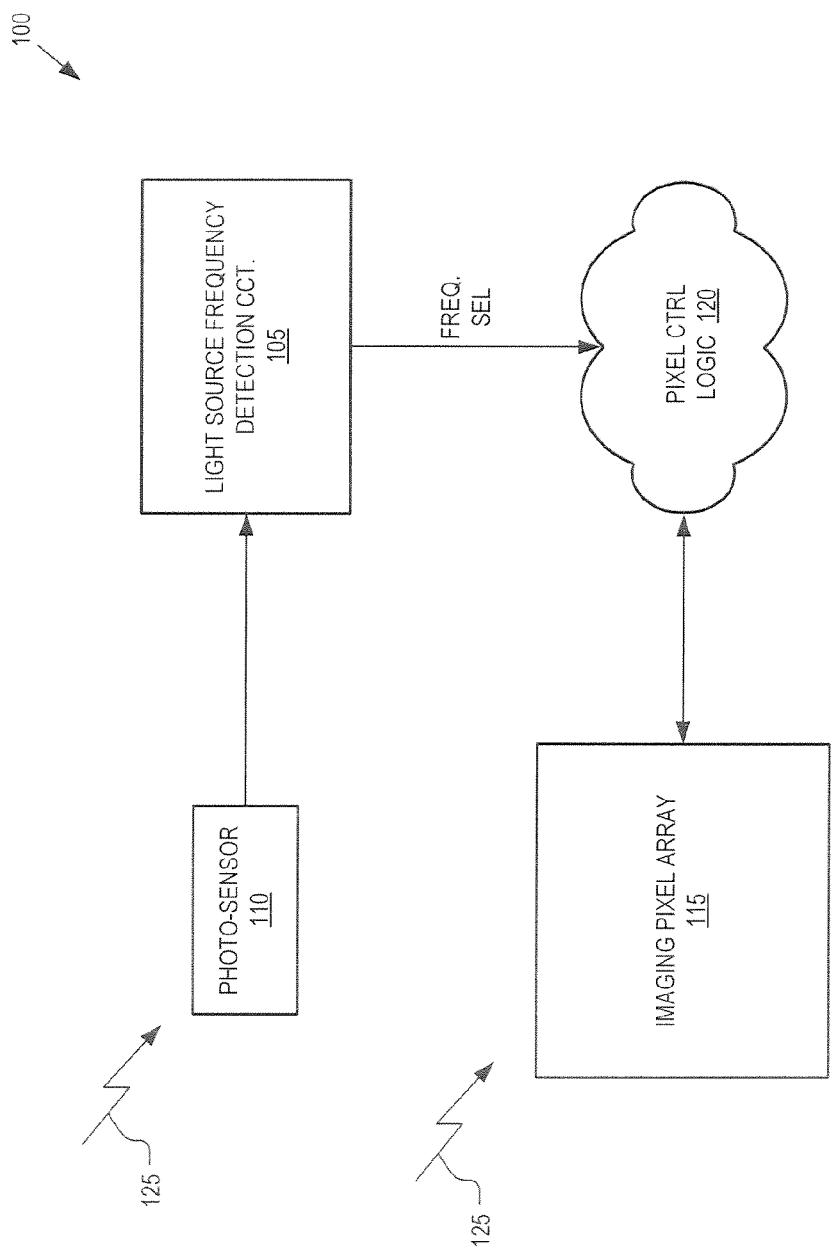
FIG. 1 is a functional block diagram illustrating an imaging system, in accordance with an embodiment of the invention.

FIG. 1 is a functional block diagram illustrating an imaging system 100, in accordance with an embodiment of the invention. The illustrated embodiment of imaging system 100 includes a light source frequency detection circuit 105, a photo-sensor 110, an imaging pixel array 115, and pixel control logic 120.

Imaging system 100 may be included within any number of electronic devices, such as video cameras, still image cameras, optical scanners, or other light sensing devices. Imaging pixel array 115 may be implemented with a variety of different imaging technologies, such as charged-coupled device ("CCDs") arrays, complementary metal-oxide-semiconductor ("CMOS") arrays, or other semiconductor or non-semiconductor imaging arrays. Pixel control logic 120 is coupled to imaging pixel array 115 to control and manage imaging pixel array 115 during operation. For example, pixel control logic 120 may configure operating parameters of imaging pixel array 115, reset the individual pixels, shift acquired images out of imaging pixel array 115, or otherwise. Some of the operating parameters controlled by pixel control logic 120 may include setting an exposure time, synchronizing image acquisition, setting image gain, or otherwise.

In one embodiment, photo-sensor 110 is a standalone sensor distinct from imaging pixel array 115. In another embodiment, photo-sensor 110 may represent one or more pixel elements from within imaging pixel array 115. In one embodiment, photo-sensor 110 is implemented with a photosensitive bipolar junction transistor ("BJT"). A BJT provides broad range luminance operation due to the current gain characteristic of a BJT. Photo generated current is created when electrons are liberated at a P-N junction of the BJT by an incident photon. The one-to-one relationship between an incident photon and the liberated electrons of the photo generated current is greatly multiplied by the gain factor of a BJT. This gain factor provides BJT's with improved low luminance photo sensitive operation compared to a simple diode P-N junction.

During operation, photo-sensor 110 and light source frequency detection circuit 105 operate to determine the power frequency of external light 125. Light 125 may be light from the object person being imaged or ambient light. Once light source frequency detection circuit 105 determines the power frequency of light 125, it outputs a frequency select ("FREQ SEL") signal to pixel control logic 120. In response, pixel control logic 120 configures operational parameters of imaging pixel array 115 to compensate for the power frequency of light 125. As discussed above, depending upon the geographic region, light 125 will typically be generated by a light source having one of two power frequencies; 50 Hz (predominant in Europe) or 60 Hz (predominant in North America).

Figure 2:
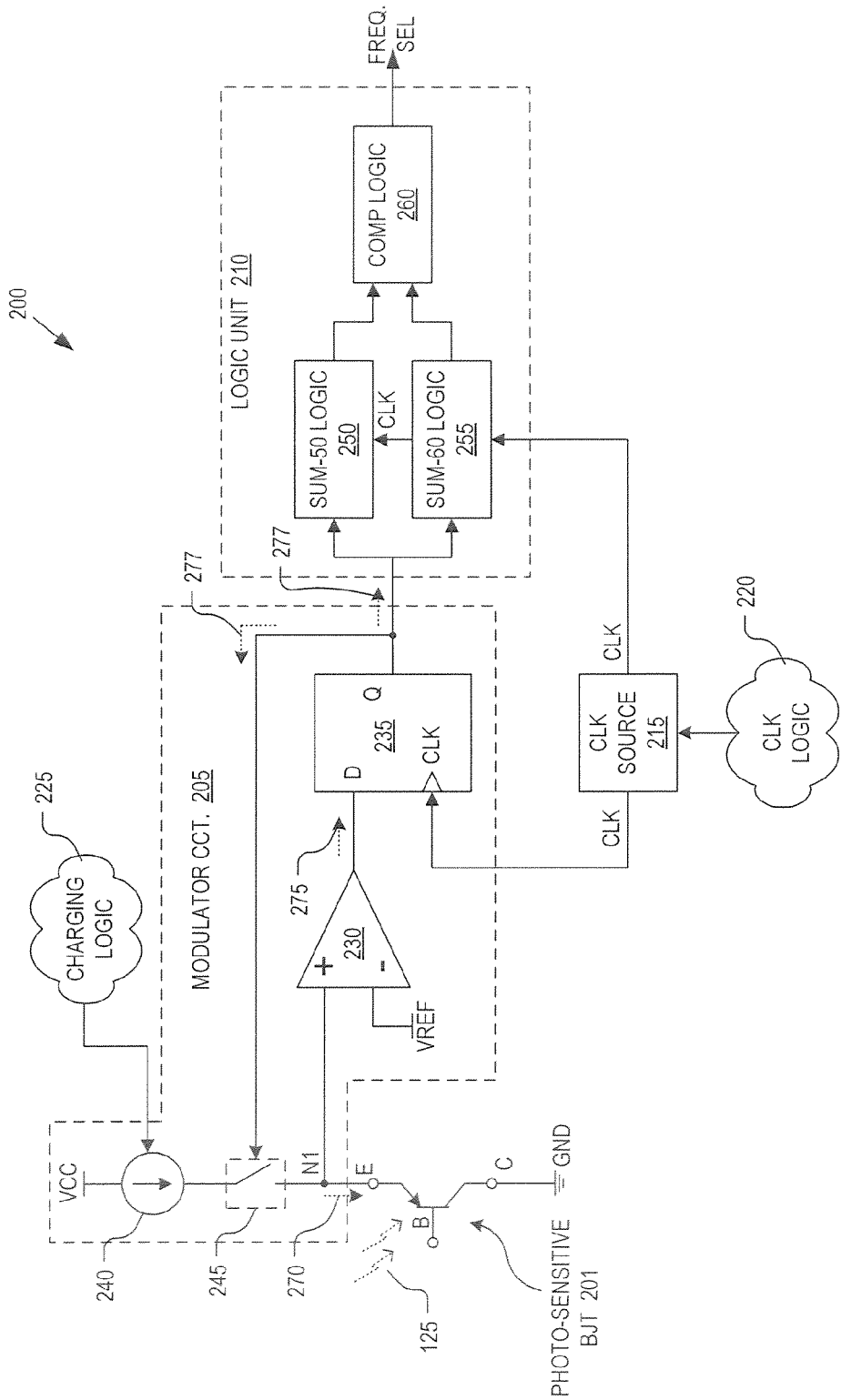
FIG. 2 is a functional block diagram illustrating a light source frequency detection circuit, in accordance with an embodiment of the invention.

FIG. 2 is a functional block diagram illustrating a light source frequency detection circuit 200, in accordance with an embodiment of the invention. Light source frequency detection circuit 200 is one possible embodiment of light source frequency detection circuit 105 illustrated in FIG. 1. The illustrated embodiment light source frequency detection circuit 200 includes a modulator circuit 205, a logic unit 210, a clock source 215, clock logic 220, and charging logic 225. The illustrated embodiment of modulator circuit 205 includes a comparator 230, a latch 235, a charging source 240, and a switch 245. The illustrated embodiment of logic unit 210 includes sum-50 logic 250, sum-60 logic 255, and comparator logic 260.

In one embodiment, modulator circuit 205 operates as a sigma delta modulator that converts a variable electrical signal 270 (e.g., variable current flowing into the emitter terminal of photo-sensitive BJT 201) output by photo-sensitive BJT 201 into a modulated signal 275 output by comparator 230. Modulated signal 275 is then synchronized to the clock signal CLK by latch 235 and output on sample output Q as modulated signal 277. Modulated signal 277 is fed back to a control terminal of switch 245 (e.g., transistor switch) to selectively enable/disable switch 245. When switch 245 is closed circuited, node N1 is coupled to charging source 240. Comparator 230 may be implemented with an analog comparator for comparing the voltage at node N1 with a reference voltage VREF. Latch 235 may be implemented as a flip-flop, such as a D flip-flop having a sample input D, a sample output Q, and a clock input CLK. The operation of modulator circuit 205 is discussed in detail below in connection with FIG. 4.

In one embodiment, charging source 240 is a current source. In one embodiment, charging source 240 is a variable charging source capable of charging node N1 at a variable rate selected by charging logic 225. Charging logic 225 may be coupled to photo-sensitive BJT 201 or another photo-sensitive element to determine the intensity of light 125 and adjust the charging rate of charging source 240 appropriately. By adjusting the charging rate of charging source 240, the luminance range of light source frequency detection circuit 200 may be adjusted to compensate for a stronger/weaker electrical signal 270 when light 125 incident on photo-sensitive BJT 201 is more/less intense.

In one embodiment, clock source 215 can generate an adjustable clock signal CLK under control of clock logic 220. Clock logic 220 may vary the frequency of the clock signal CLK to increase or decrease the dynamic range of light source frequency detection circuit 200. For example, by increasing the clock frequency low light performance is improved. However, the low light improvements derived by increasing the clock frequency are limited by charge injection and clock feed through from switch 245. In one embodiment, the clock signal CLK is approximately 3 MHz. Other frequencies may be used.

Logic unit 210 is coupled to receive modulated signal 277 and the clock signal CLK. Based upon modulated signal 277 and the clock signal CLK, logic unit 210 is capable of determining the toggle frequency of modulated signal 277, which is substantially proportional (e.g., 2 times) to the power frequency of incident light 125. In one embodiment, logic unit 210 is implemented in hardware using digital signal processing ("DSP") techniques. In other embodiments, logic unit 210 may be implemented by software executing on a general purpose processor, an application specific integrated circuit ("ASIC"), a combination thereof, or otherwise. The operation of logic unit 210 is described in detail below in connection with FIGS. 5, 6A, and 6B.

Figures 3A, 3B, 3C:
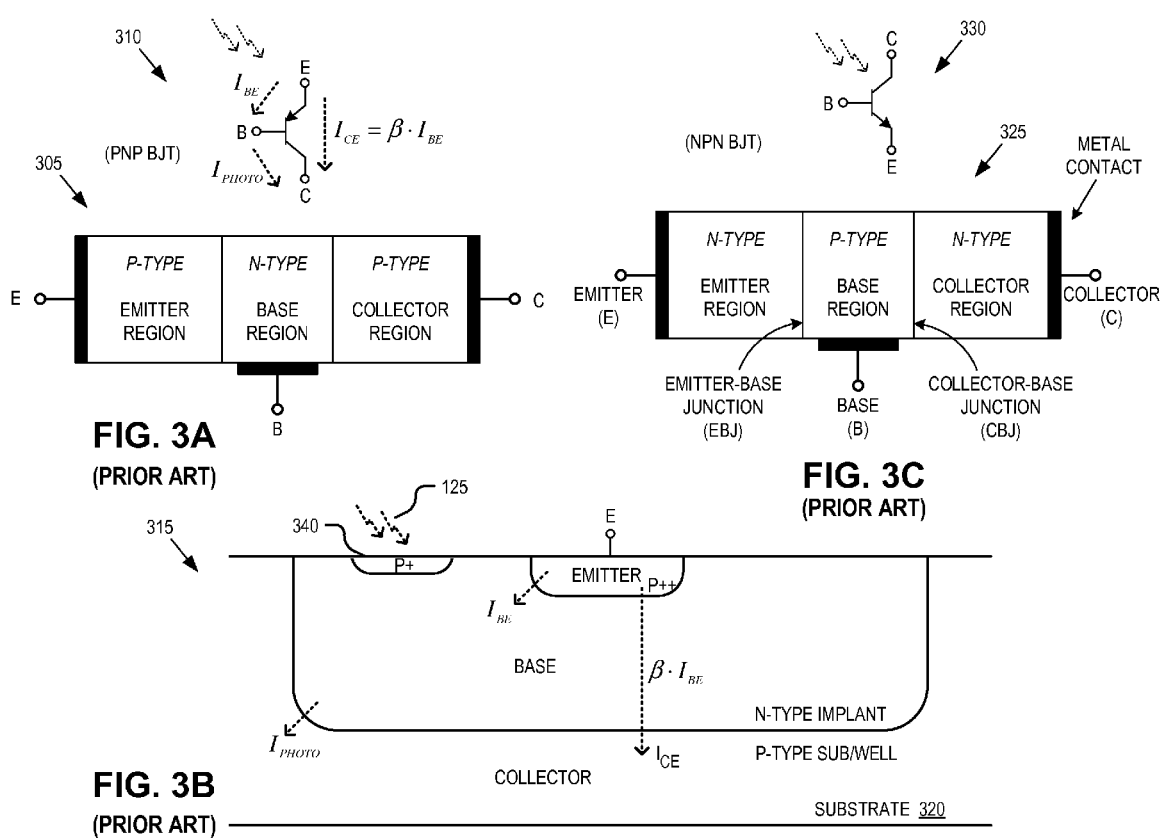
FIG. 3A illustrates a simplified structure of a pnp bipolar junction transistor ("BJT") including its corresponding circuit symbol for use with embodiments of the invention.
FIG. 3B is a block diagram illustrating an example of a pnp BJT formed in a semiconductor substrate for use with embodiments of the invention.
FIG. 3C illustrates a simplified structure of an npn BJT including its corresponding circuit symbol for use with embodiments of the invention.

FIGS. 3A, 3B, and 3C illustrate example embodiments of photo-sensitive BJT 201, in accordance with embodiments of the invention. Photo-sensitive BJT 201 may be implemented as either a pnp-type BJT (illustrated in FIG. 3A) or an npn-type BJT (illustrated in FIG. 3C). FIG. 3A illustrates a simplified structure of a pnp-type BJT 305 along with its corresponding circuit symbol 310. FIG. 3B is a block diagram illustrating an example implementation of a pnp-type BJT 315 formed in a semiconductor substrate 320 (e.g., silicon substrate). FIG. 3C illustrates a simplified structure of an npn-type BJT 325 along with its corresponding circuit symbol 330.

As illustrated in FIG. 3B, when light 125 impinges upon the surface of BJT 315, a photo current $I_{PHOTO}$ is generated at the P-N junction between the base and the collector, resulting in a net emitter-base voltage. To compensate for the photo generated current $I_{PHOTO}$ and the net emitter-base voltage, an emitter-base current $I_{BE}$ will flow. Due to the gain factor β of BJT 315, an emitter to collector current $I_{CE}$ will also flow having a magnitude approximately equal to $\beta \cdot I_{BE}$. Since the current flow in and out of a transistor terminal must sum to zero, the total current $I_E$ (i.e., electrical signal 270 in FIG. 2) flowing into the emitter terminal is given by equation 1, $$I_E = I_{BE} + \beta \cdot I_{BE} = I_{BE} \cdot (1+\beta) \quad \text{(Equation 1)}$$

The gain factor β for a BJT fabricated in a CMOS process is approximately 30. A typical BJT formed in a bipolar or biCMOS process can have a β of up to several hundred and some special processes can even produce a BJT with a β of approximately 1000. However, to produce a BJT with a β significantly higher than 30 in a CMOS process involves additional mask work, and thus, a higher fabrication cost. Therefore, the photo generated current $I_{PHOTO}$ is magnified by a factor of 31 by BJT 315 or photo-sensitive BJT 201 fabricated using a typical CMOS process. Accordingly, photo-sensitive BJT 201 provides significant low noise amplification to enable light source frequency detection circuit 200 to operate in low luminous environments.

In one embodiment, BJT 315 is formed in substrate layer 320 having p-type dopant profile for the collector, an n-type dopant implant for the base, and a p-type dopant implant for the emitter. BJT 315 may optionally also include a pinning layer 340 formed on the surface of the base region.

Figure 4:
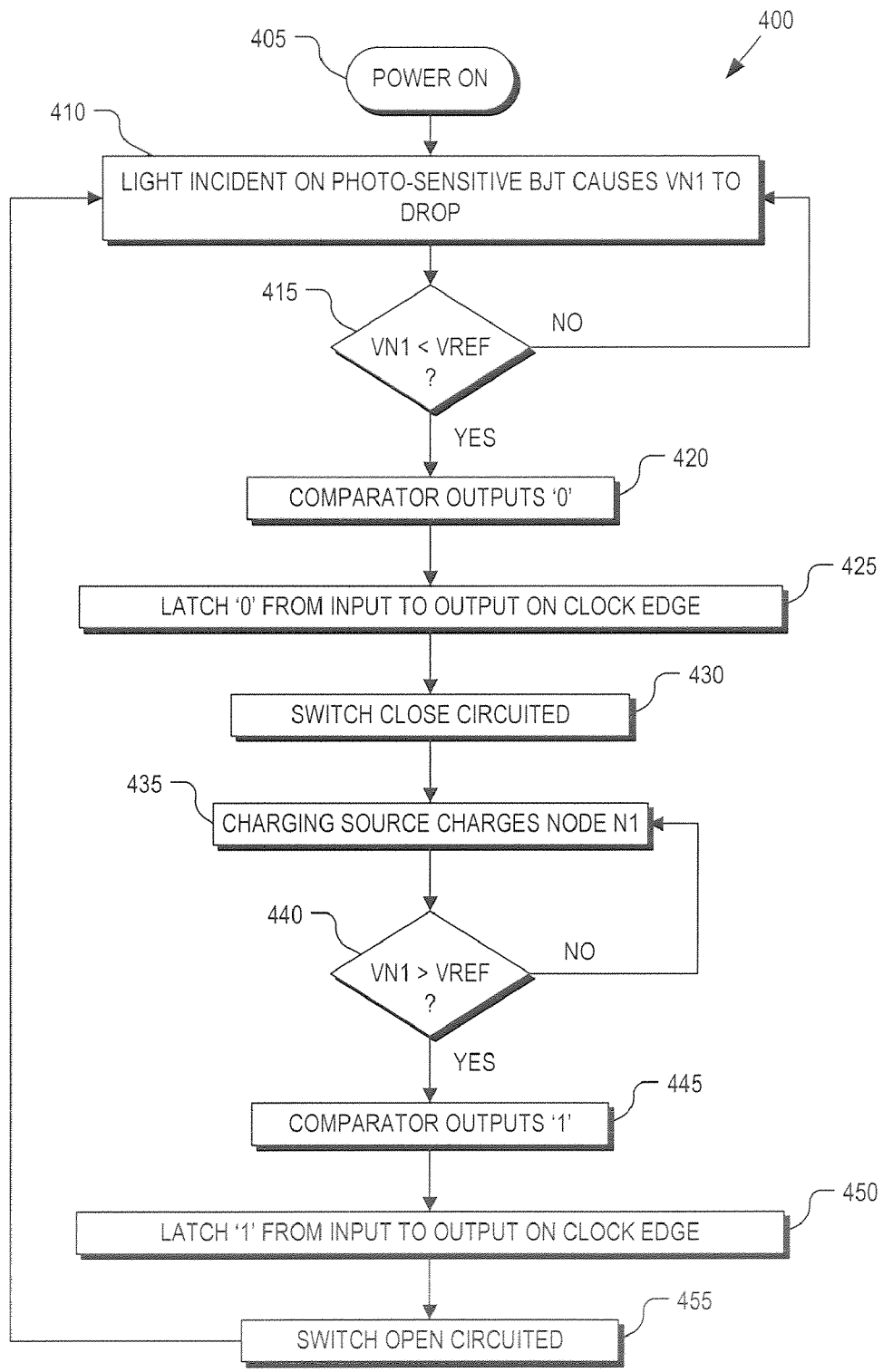
FIG. 4 is a flow chart illustrating operation of a modulation circuit of a light source frequency detection circuit, in accordance with an embodiment of the invention.

FIG. 4 is a flow chart illustrating a process 400 for operation of modulator circuit 200, in accordance with an embodiment of the invention. The order in which some or all of the process blocks appear in process 400 should not be deemed limiting. Rather, one of ordinary skill in the art having the benefit of the present disclosure will understand that some of the process blocks may be executed in a variety of orders not illustrated.

In a process block 405, light source frequency detection circuit 200 is powered on and photo-sensitive BJT 201 exposed to a light source emitting light 125. In a process block 410, incident light 125 causes photo-sensitive BJT 201 to generate electrical signal 270. In the illustrated embodiment, electrical signal 270 has the effect of pulling down node N1 coupled to the positive input of comparator 230 towards ground (GND). It should be appreciated that the circuit of FIG. 2 may be modified to pull node N1 up towards the high supply voltage VCC instead.

In a decision block 415, when the voltage on node N1 is pulled below the reference voltage VREF coupled to the negative terminal of comparator 230, modulated signal 275 is toggled low to '0' (process block 420). Modulated signal 275 output by comparator 230 is synchronized to the clock signal CLK by latch 235. In a process block 425, latch 235 latches the '0' value on its sample input D to its sample output Q.

Modulated signal 277 (synchronized version of modulated signal 275) is fed back to control switch 245 and selectively enable/disable charging of node N1. In a process block 430, the '0' value of modulated signal 277 causes switch 245 to close circuit, thereby coupling charging source 240 to node N1. In a process block 435, charging source 240 commences charging node N1 until voltage (VN1) on node N1 is pulled above VREF (decision block 440). Once VN1 is greater than VREF, comparator 230 toggles its output high '1' (process block 445), which is then latched by latch 235 from its sample input D to its sample output Q (process block 450). Accordingly, latch 235 operates to generate a '0' pulse or a '1' pulse according to the voltage VN1 on node N1. The pulses have a pulse width determined by the width of the clock signal CLK. Finally, in process block 455, switch 245 is open circuited under control of modulated signal 277. Process 400 then returns to process block 410 and repeats to generate 277.

The photocurrent generated by photo-sensitive BJT 201 varies in magnitude with the varying intensity of incident light 125. Accordingly, if incident light 125 is flickering due to a 50 Hz or 60 Hz power source, then the magnitude of electrical signal 270 will also oscillate with a corresponding 50 Hz or 60 Hz frequency (or multiple thereof). Accordingly, modulated signal 277 toggles at a rate proportional (e.g., 2 times) to the power frequency of incident light 125.

Figure 5:
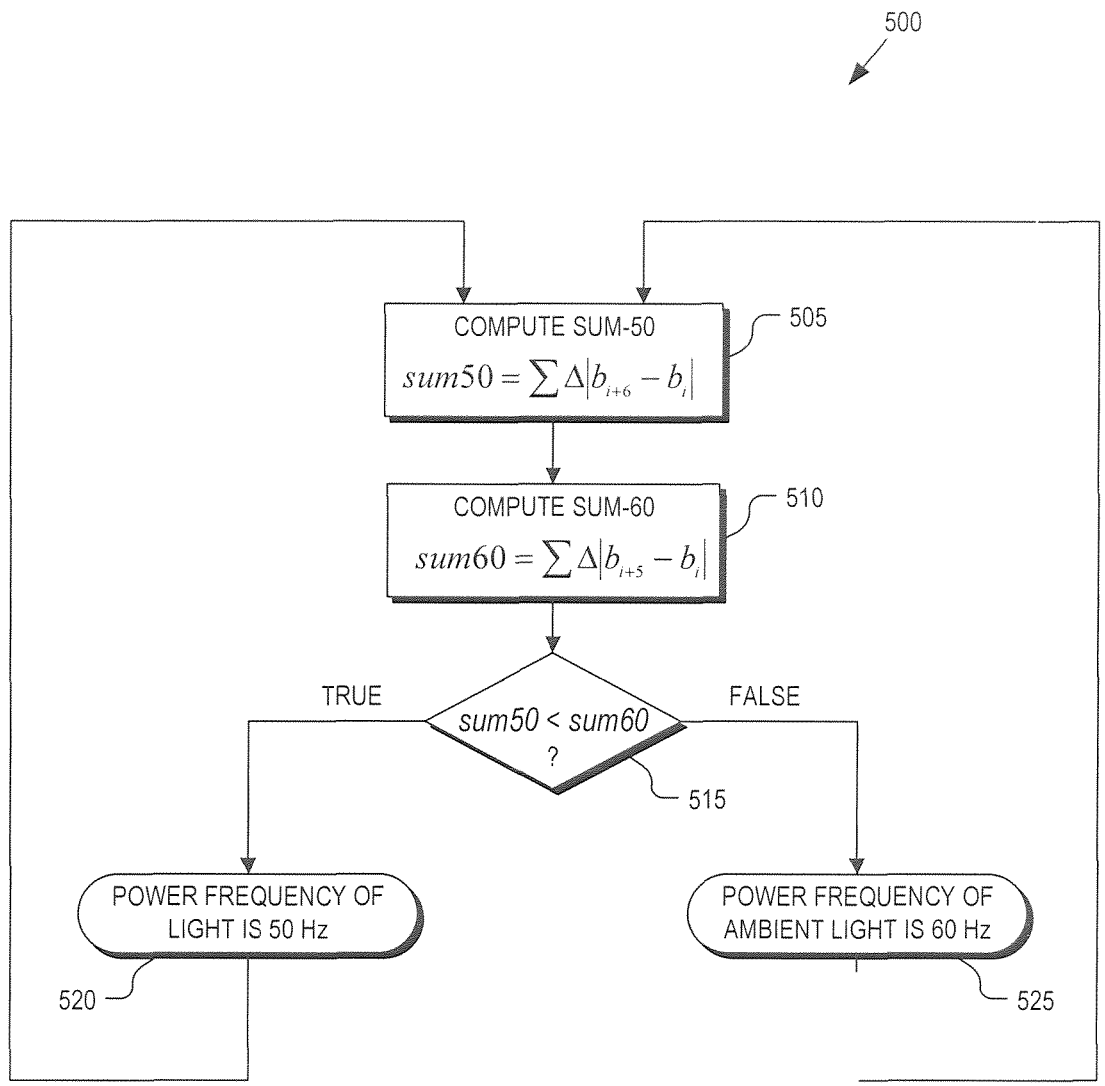
FIG. 5 is a flow chart illustrating operation of a logic unit of a light source frequency detection circuit, in accordance with an embodiment of the invention.

FIG. 5 is a flow chart illustrating a process 500 for operation of logic unit 210 for determining the toggling frequency of modulated signal 277, in accordance with an embodiment of the invention. The order in which some or all of the process blocks appear in process 500 should not be deemed limiting. Rather, one of ordinary skill in the art having the benefit of the present disclosure will understand that some of the process blocks may be executed in a variety of orders not illustrated.

Logic unit 210 operates to determine the frequency of modulated signal 277 by generating two summation values and then comparing these summations values to generate the frequency select signal. Modulated signal 277 is coupled into both sum-50 logic 250 and sum-60 logic 255. In a process block 505, sum-50 logic 250 computes a sum50 according to equation (2) below $$\text{sum}50 = \Sigma \Delta |b_{i+6} + b_i|,\qquad\text{(Equation 2)}$$

where $b_i$ represents an area under a curve per sampling block i of modulated signal 277. Referring to FIG. 6A, a 50 Hz sampling plot 605 of intensity versus time is illustrated. The flickering nature of a light 125 due to its AC power source generates a sine curve 610 in modulated signal 277. Modulated signal 277 may be sampled at a rate determined by the clock signal CLK (e.g., 3 MHz). Each sampling block S0, S1 . . . SN (i.e., i=0, 1 . . . N) includes a plurality of sample points (represented as dotted vertical lines under sine curve 610) along sine curve 610. For example, each sample block i may include 5000 sample points, depending upon the frequency of the clock signal CLK. The coefficients $b_0$, $b_1$, $b_2$, . . . $b_N$ represent the summation or integration of these sample points within the associated sampling block i, which also represents the area under sine curve 610 within the associated sampling block i. The summation sum50 may be accumulated by sum-50 logic 250 for a fixed period of time (e.g., 1 second) or a fixed number clock cycles, and then repeated.

In a process block 510, sum-60 logic 255 computes a sum60 according to equation (3) below, $$\text{sum}60 = \Sigma \Delta |b_{i+5} - b_i|,\qquad\text{(Equation 3)}$$

where $b_i$ represents an area under a curve per sampling block i of modulated signal 277. Referring to FIG. 6B, a 60 Hz sampling plot 615 of intensity versus time is illustrated. The flickering nature of light 125 due to its AC power source generates a sine curve 620 in modulated signal 277. Again, modulated signal 277 is sampled at a rate determined by the clock signal CLK (e.g., 3 MHz). Each sampling block S0, S1 . . . SN (i.e., i=0, 1 . . . N) includes a plurality of sample points (represented as dotted vertical lines under sine curve 620) along sine curve 620. For example, each sample block i may include 5000 sample points, depending upon the frequency of the clock signal CLK. The coefficients $b_0$, $b_1$, $b_2$, . . . $b_N$ represent the summation or integration of these sample points within the associated sampling block i, which also represents the area under sine curve 620 within the associated sampling block i. The summation sum60 may be accumulated by sum-60 logic 255 for a fixed period of time (e.g., 1 second) or a fixed number clock cycles, and then repeated. Since sum50 and sum60 are both generated based on modulated signal 277, process blocks 505 and 510 may be performed sequentially in any order, or in parallel.

Once sum-50 logic 250 and sum-60 logic 255 have generated their respective summation values sum50 and sum60, comparator logic 260 compares the two summation values to determine which is greater (decision block 515). If comparator logic 260 determines that sum50 is less than sum60, then the power frequency of light 125 is determined to be 50 Hz and comparator logic 260 outputs the frequency select signal indicating such (process block 520). If comparator logic 260 determines that sum50 is greater than sum60, then the power frequency of light 125 is determined to be 60 Hz and comparator logic 260 outputs the frequency select signal indicating such (process block 525). The frequency select signal may be provided to pixel control logic 120 to adjust operational parameters of imaging pixel array 115 and improve image acquisition.

The processes explained above are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like.

A machine-accessible medium includes any mechanism that provides (i.e., stores) information in a form accessible by a machine (e.g., a computer, network device, personal digital assistant, manufacturing tool, any device with a set of one or more processors, etc.). For example, a machine-accessible medium includes recordable/non-recordable media (e.g., read only memory (ROM), random access memory (RAM), magnetic disk storage media, optical storage media, flash memory devices, etc.)

The above description of illustrated embodiments of the invention, including what is described in the Abstract, is not intended to be exhaustive or to limit the invention to the precise forms disclosed. While specific embodiments of and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus for determining a power frequency of a light source, the apparatus comprising:
    a bipolar junction transistor ("BJT") coupled to generate an electrical signal responsive to light incident thereon;
    a modulator circuit coupled to the BJT to generate a modulated signal based on the electrical signal that toggles at a rate substantially proportional to the power frequency of the light source; and
    a logic unit coupled to the modulator circuit to determine a toggling frequency of the modulated signal and to generate a frequency select signal indicating the power frequency of the light source,
    wherein the modulator circuit comprises:
        a comparator including first and second comparator inputs and a comparator output, the first comparator input coupled to the BJT and the second comparator input coupled to receive a reference signal; and
        a charging source coupled to selectively charge the first comparator input in response to the comparator output.

2. The apparatus of claim 1, wherein the BJT comprises a photo-sensitive pnp-type BJT.

3. The apparatus of claim 2, wherein an emitter terminal of the photo-sensitive pnp-type BJT is coupled to the modulator circuit and a collector terminal of the photo-sensitive pnp-type BJT is coupled to a voltage rail.

4. The apparatus of claim 1, wherein the BJT comprises a photo-sensitive npn-type BJT.

5. The apparatus of claim 1, wherein the logic unit comprises:
    first summation logic for generating a first summation $sum50=\Sigma\Delta|b_{i+6}-b_i|$;
    second summation logic for generating a second summation $sum60=\Sigma\Delta|b_{i+5}-b_i|$, wherein $b_i$ represents an area under a curve per sampling block i of the modulated signal; and
    comparator logic coupled to the first and second summation logic for determining whether the first summation sum50 is greater than the second summation sum60 and coupled to generate the frequency select signal in response to the determining.

6. The apparatus of claim 1, wherein the modulator circuit further comprises a flip-flop coupled between the comparator output and the logic unit, the flip-flop comprising:
    a sample input coupled to the comparator output;
    a sample output coupled to the logic unit; and
    a clock input coupled to receive a clock signal.

7. The apparatus of claim 6, wherein the modulator circuit further comprises a switch coupled between the charging source and the BJT, a control terminal of the switch coupled to the sample output of the flip-flop to selectively control coupling of the charging source to the BJT responsive to the sample output.

8. The apparatus of claim 7, wherein the charging source comprises a current source and the flip-flop comprises a D flip-flop.

9. The apparatus of claim 1, further comprising charging logic coupled to control a charging rate of the charging source dependent upon intensity of the light incident upon the BJT.

10. A method for determining a power frequency of a light source, comprising:
    generating an electrical signal responsive to light emitted from the light source and impinging upon a photo-sensitive transistor;
    generating a modulation signal toggling at a rate substantially proportional to the power frequency of the light; and
    determining the power frequency of the light based at least in part upon the modulation signal, wherein determining the power frequency of the light comprises:
        generating a first summation sum50, wherein $sum50=\Sigma\Delta|b_{i+6}-b_i|$, wherein $b_i$ represents an area under a curve per sampling block i of the modulated signal;
        generating a second summation sum60, wherein $sum60=\Sigma\Delta|b_{i+5}-b_i|$;
        comparing the first summation sum50 to the second summation sum60; and
        generating a frequency select signal indicating the power frequency based upon the comparing.

11. The method of claim 10, wherein the photo-sensitive transistor comprises a bipolar junction transistor.

12. The method of claim 10, wherein generating the modulation signal comprises:
    coupling the electrical signal to a circuit node;
    comparing a voltage of the circuit node to a reference voltage; and
    toggling the modulation signal based on the comparing.

13. The method of claim 12, wherein generating the modulation signal further comprises:
    latching the modulation signal synchronized to a clock source; and
    selectively charging or discharging the circuit node responsive to the modulation signal.

14. The method of claim 13, further comprising adjusting a dynamic range of the determining of the power frequency by adjusting a clock frequency of the clock source.

15. The method of claim of claim 13, further comprising adjusting a luminance range of the photo-sensitive transistor by adjusting a rate of the selectively charging or discharging of the circuit node.

16. The method of claim 10, further comprising adjusting operating parameters of a pixel array for capturing images based on the frequency select signal.

17. An imaging system, comprising:
    a pixel array for capturing an image;
    a photo-sensitive transistor to generate a current signal responsive to light incident on the photo-sensitive transistor;
    a modulator circuit coupled to the photo-sensitive transistor to generate a modulated signal responsive to the current signal; and
    a logic unit coupled to the modulator circuit to receive the modulated signal and to determine a power frequency of the light incident on the photo-sensitive transistor based on the modulated signal, the logic unit further coupled to generate a frequency select signal indicating the power frequency of the light, wherein at least one operating characteristic of the pixel array is adjustable responsive to the frequency select signal,
    wherein the modulator circuit comprises:
        a comparator including first and second comparator inputs and a comparator output, the first comparator input coupled to the photo-sensitive transistor and the second comparator input coupled to receive a reference signal; and a charging source coupled to selectively charge the first comparator input in response to the comparator output.

18. The imaging system of claim 17, wherein the logic unit comprises:

first summation logic coupled to receive the modulated signal and to generate a first summation according to $sum50 = \Sigma \Delta |b_{i+6} - b_i|$;

second summation logic coupled to receive the modulated signal and to generate a second summation according to $sum60 = \Sigma \Delta |b_{i+5} - b_i|$, wherein $b_i$ represents area under a curve per sampling block i of the modulated signal; and comparator logic coupled to the first and second summation logic to determine whether sum50 is greater than sum60 and to output the frequency select signal.

19. The imaging system of claim 17, wherein the modulator circuit further comprises:

a latch including a data input coupled to the comparator output and a data output, wherein the charging source is coupled to selectively charge the first comparator input in response to the data output of the latch.

20. The imaging system of claim 19, further comprising a clock source coupled to clock the latch and coupled to the logic unit, wherein the modulator circuit operates without feedback control from the logic unit.

21. The imaging system of claim 19, further comprising charging logic coupled to the charging source to control a charging rate of the charging source dependent upon intensity of the light incident on the photo-sensitive transistor.

22. The imaging system of claim 20, further comprising clock logic coupled to the clock source to adjust a sampling frequency of the photo-sensitive transistor by adjusting a clock frequency of the clock source.

23. The imaging system of claim 19, wherein the photo-sensitive transistor comprises a photo-sensitive pnp-type bipolar junction transistor having an emitter terminal coupled to the first comparator input.

24. The imaging system of claim 17, wherein the photo-sensitive transistor comprises a bipolar junction transistor.

* * * * *

UNITED STATES PATENT AND TRADEMARK OFFICE
CERTIFICATE OF CORRECTION

PATENT NO. : 7,847,834 B2
APPLICATION NO. : 11/942604
DATED : December 7, 2010
INVENTOR(S) : Dai et al.

It is certified that error appears in the above-identified patent and that said Letters Patent is hereby corrected as shown below:

On the Title Page, in the Abstract, Line 2, delete "modulators" and replace with -- modulator --.

In Column 5, Line 52, delete "$sum50 = \sum \Delta |b_{i+6} + b_i|$," and replace with -- $sum50 = \sum \Delta |b_{i+6} - b_i|$, --.

Signed and Sealed this
Twenty-fourth Day of May, 2011

David J. Kappos
Director of the United States Patent and Trademark Office